United States Patent
Anderson et al.

(10) Patent No.: US 8,895,430 B2
(45) Date of Patent: Nov. 25, 2014

(54) METHOD OF MAKING A SEMICONDUCTOR DEVICE COMPRISING A LAND GRID ARRAY FLIP CHIP BUMP SYSTEM WITH SHORT BUMPS

(75) Inventors: Samuel J. Anderson, Tempe, AZ (US); Gary Dashney, Phoenix, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 131 days.

(21) Appl. No.: 13/434,660

(22) Filed: Mar. 29, 2012

(65) Prior Publication Data

US 2012/0248601 A1    Oct. 4, 2012

Related U.S. Application Data

(60) Provisional application No. 61/470,401, filed on Mar. 31, 2011.

(51) Int. Cl.
*H01L 21/44*     (2006.01)
*H01L 23/00*     (2006.01)
*H01L 23/31*     (2006.01)

(52) U.S. Cl.
CPC ............... *H01L 24/11* (2013.01); *H01L 24/13* (2013.01); *H01L 2224/16225* (2013.01); *H01L 2224/73204* (2013.01); *H01L 2224/81191* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01079* (2013.01); *H01L 2924/01082* (2013.01); *H01L 2924/01023* (2013.01); *H01L 2924/01033* (2013.01); *H01L 2924/01322* (2013.01); *H01L 2924/014* (2013.01); *H01L 2924/13091* (2013.01); *H01L 2224/13006* (2013.01); *H01L 2224/05027* (2013.01); *H01L 23/3128* (2013.01); *H01L 24/16* (2013.01); *H01L 24/81* (2013.01); *H01L 2224/03* (2013.01);

(Continued)

(58) Field of Classification Search
CPC . H01L 24/10; H01L 24/12; H01L 2224/0401; H01L 225/06513
USPC .......... 438/613, 113, 108, 612, 632; 257/778, 257/E21.508
See application file for complete search history.

(56) References Cited

U.S. PATENT DOCUMENTS

| | | | |
|---|---|---|---|
| 6,093,972 A * | 7/2000 | Carney et al. | 257/790 |
| 2004/0127010 A1 * | 7/2004 | Chen et al. | 438/612 |

(Continued)

*Primary Examiner* — Marcos D. Pizarro
*Assistant Examiner* — Cesar Lopez
(74) *Attorney, Agent, or Firm* — Robert D. Atkins; Patent Law Group: Atkins and Associates, P.C.

(57) ABSTRACT

A semiconductor device has a semiconductor wafer with a plurality of semiconductor die including a plurality of contact pads. An insulating layer is formed over the semiconductor wafer and contact pads. An under bump metallization (UBM) is formed over and electrically connected to the plurality of contact pads. A mask is disposed over the semiconductor wafer with a plurality of openings aligned over the plurality of contact pads. A conductive bump material is deposited within the plurality of openings in the mask and onto the UBM. The mask is removed. The conductive bump material is reflowed to form a plurality of bumps with a height less than a width. The plurality of semiconductor die is singulated. A singulated semiconductor die is mounted to a substrate with bumps oriented toward the substrate. Encapsulant is deposited over the substrate and around the singulated semiconductor die.

6 Claims, 10 Drawing Sheets

(52) U.S. Cl.
CPC . *H01L 2224/0345* (2013.01); *H01L 2224/0346* (2013.01); *H01L 2224/0401* (2013.01); *H01L 2224/05022* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05558* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/11849* (2013.01); *H01L 2224/13014* (2013.01); *H01L 2224/13109* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/81815* (2013.01); *H01L 2224/94* (2013.01)
USPC .......... 438/613; 438/108; 438/612; 257/778; 257/E21.508

(56) References Cited

U.S. PATENT DOCUMENTS

| | | | |
|---|---|---|---|
| 2006/0046434 A1* | 3/2006 | Su et al. | 438/460 |
| 2007/0087548 A1* | 4/2007 | Hsieh et al. | 438/613 |
| 2010/0109159 A1* | 5/2010 | Ho et al. | 257/737 |
| 2011/0101527 A1* | 5/2011 | Cheng et al. | 257/738 |

* cited by examiner

US 8,895,430 B2

METHOD OF MAKING A SEMICONDUCTOR DEVICE COMPRISING A LAND GRID ARRAY FLIP CHIP BUMP SYSTEM WITH SHORT BUMPS

CLAIM TO DOMESTIC PRIORITY

The present non-provisional application claims the benefit of U.S. Provisional Application No. 61/470,401, filed Mar. 31, 2011.

FIELD OF THE INVENTION

The present invention relates in general to semiconductor devices and, more particularly, to a semiconductor device and method of forming a land grid array flip chip bump system.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

One common technique of interconnecting a semiconductor die with a printed circuit board or other device involves the use of solder bumps. FIG. 1 shows a conventional under bump metallization (UBM) solder bump structure 10. Solder bump structure 10 includes a semiconductor die 11 including a semiconductor wafer of base silicon 12 over which an active area 14 is formed. Active area 14 includes analog or digital circuits implemented as active devices, passive devices, conductive layers, and dielectric layers formed within semiconductor die 11 and electrically interconnected according to the electrical design and function of the semiconductor die. An electrically conductive layer 16 is formed over active area 14 of semiconductor die 11, and operates as a contact pad. An insulating or passivation layer 18 is formed over semiconductor die 11 and conductive layer 16. A portion of insulating layer 18 is removed by an etching process to form opening 20 in the insulating layer that exposes a portion of conductive layer 16. In one embodiment, opening 20 has a width of 270 micrometers ($\mu$m). An electrically conductive or UBM layer 22 is formed over, and conformally applied to, conductive layer 16, within opening 20, and over a portion of insulating layer 18. In one embodiment, conductive layer 22 includes an adhesion layer, barrier layer, and wetting layer comprising aluminum (Al), nickel vanadium (NiV), and copper (Cu) respectively. An insulating or passivation layer 24 such as benzocyclobutene (BCB) is formed over conductive layer 22 and insulating layer 18. An opening 26 in insulating layer 24 is formed over and exposes a portion of UBM 22. In one embodiment, opening 26 has a width of 280 $\mu$m. A conductive bump 28 is disposed over conductive layers 16 and 22, and within openings 20 and 26 to complete conventional UBM solder bump structure 10. In one embodiment, conductive bump 28 includes a preformed solder sphere with a predetermined diameter of 350 $\mu$m that is mounted to conductive layer 22 in a ball drop process.

FIG. 2 shows semiconductor die 11 with the conventional UBM solder bump structure 10 from FIG. 1 packaged as part of an over molded system in package (SiP) 32. Semiconductor die 11 is mounted to substrate or multilayered printed circuit board (PCB) 34 which further includes conductive contacts 36. Underfill 38 is deposited around bumps 28 and between substrate 34 and active area 14 of semiconductor die 11 to improve a connection between semiconductor die 11 and substrate 34. Bumps 28 undergo multiple reflows to improve electrical and mechanical connections. The multiple reflows of bumps 28 include reflowing bumps 28 for connecting the bumps to semiconductor die 11, reflowing bumps 28 while connected to semiconductor die 11 to connect semiconductor die 11 and bumps 28 to substrate 34, reflowing bumps 28 when mounting SiP 32 to an additional substrate or multilayered PCB, and reflowing bumps 28 for the mounting of additional components to, or rework of, the additional substrate or multi-layered PCB. However, reflowing bumps 28 in some instances leads to solder bridging and electrical shorting among bumps 28 thereby causing failure of semiconductor die 11. Solder bridging and electrical shorting among bumps 28 is more likely to occur when the bumps have a fine pitch. Underfill material 38 is optimized to prevent voiding of the underfill between bumps 28 and to help prevent solder bridging and electrical shorting by keeping bump material localized during reflow. However, controlling placement of underfill material 38 is difficult and may result in the placement of the underfill with a non-uniform thickness. A non-uniform thickness of underfill material 38 is common and includes, for example, a configuration in which only a portion of a gap between semiconductor die 11 and substrate 34 on a first side of the semiconductor die is filled while an entirety of the gap on a second side of the semiconductor die is filled. Unevenly distributed underfill 38 causes an imbalance of stresses on semiconductor die 11 which can lead to cracking and failure of the semiconductor die. Furthermore, encapsulant or mold compound 40 is placed over and around semiconductor die 11. The combination of encapsulant 40 and unevenly distributed underfill 38 further causes an imbalance of stresses on semiconductor die 11 which further leads to cracking and failure of the die. Accordingly, the conventional assembly of SiP 32 with underfill 38 is prone to defects that decrease the yield and reliability of the SiP assemblies.

SUMMARY OF THE INVENTION

A need exists for attaching flip chip semiconductor die to substrates without underfill molding while controlling solder bridging and shorting among bumps and maintaining robust electrical connections. Accordingly, in one embodiment, the present invention is a method of making a semiconductor device comprising the steps of providing a semiconductor wafer with a plurality of semiconductor die including a plurality of contact pads, forming an insulating layer over the semiconductor wafer and plurality of contact pads, forming a first conductive layer over and electrically connected to the plurality of contact pads, forming a second conductive layer over and electrically connected to the first conductive layer, disposing a mask over the semiconductor wafer with a plurality of openings aligned over the plurality of contact pads, depositing a conductive bump material within the plurality of openings in the mask and on the second conductive layer, removing the mask, reflowing the conductive bump material to form a plurality of bumps with a height less than a width, and singulating the plurality of semiconductor die.

In another embodiment, the present invention is a method of making a semiconductor device comprising the steps of providing a semiconductor wafer with a semiconductor die having a contact pad, forming a UBM over and electrically connected to the contact pad, disposing a mask over the semiconductor wafer with an opening in the mask aligned over the UBM, depositing a conductive bump material within the opening in the mask and on the UBM, removing the mask, reflowing the conductive bump material to form a first bump with a height less than a width, and singulating the semiconductor die.

In another embodiment, the present invention is a method of making a semiconductor device comprising the steps of providing a semiconductor die including a contact pad, forming a UBM over the contact pad, depositing a conductive bump material over the UBM, and reflowing the conductive bump material to form a first bump with a height less than a width.

In another embodiment, the present invention is a semiconductor device comprising a semiconductor die including a contact pad. A UBM is formed over and electrically connected to the contact pad. A first bump has a height less than a width and is electrically connected to the UBM.

DETAILED DESCRIPTION OF THE DRAWINGS

Figure 1:
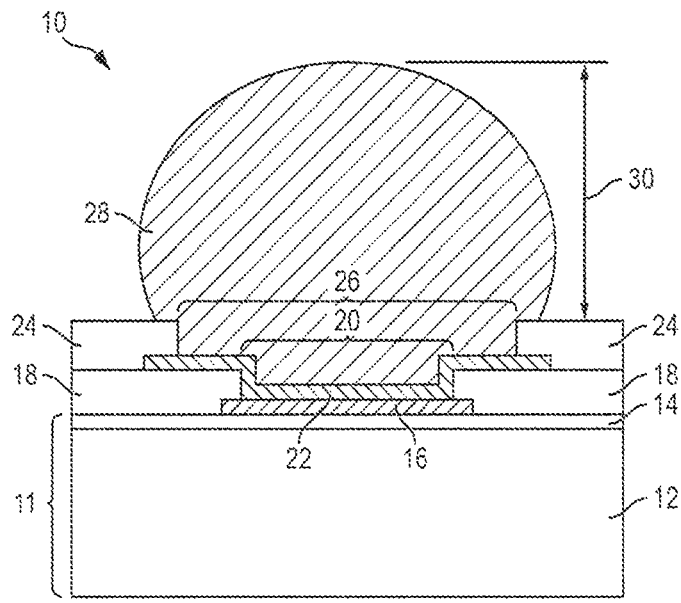
FIG. 1 illustrates a conventional UBM solder bump structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
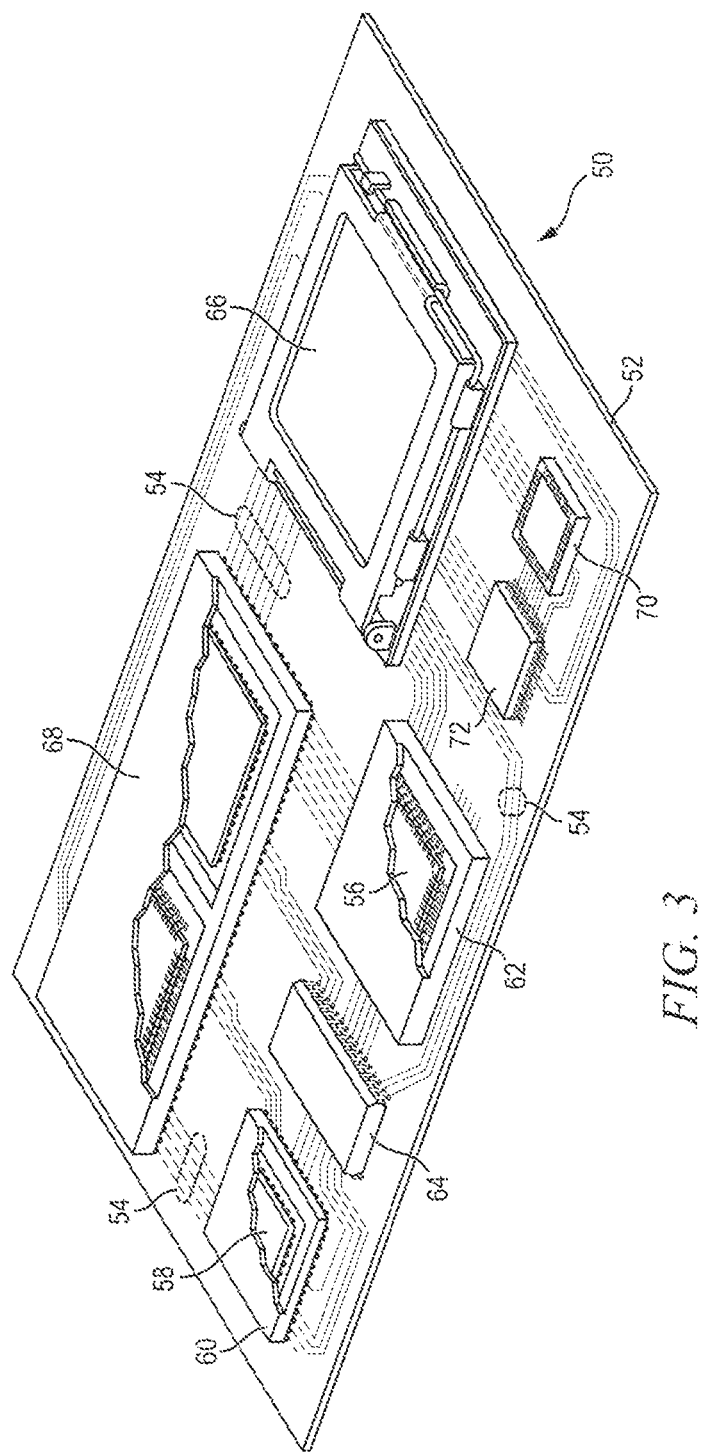
FIG. 3 illustrates a printed circuit board PCB with different types of packages mounted to its surface.

FIG. 3 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
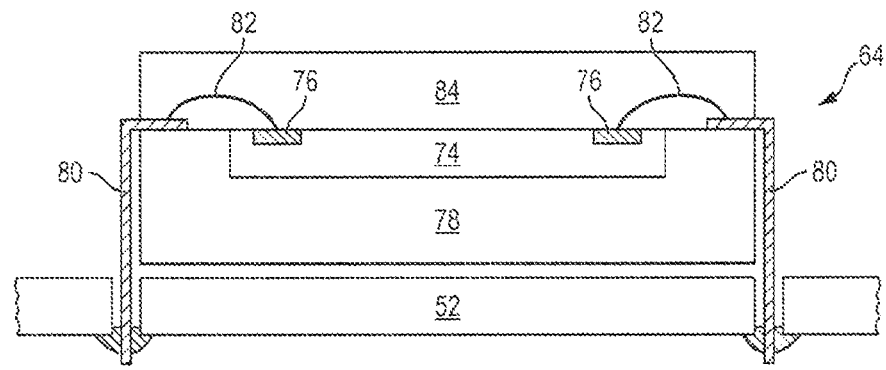
FIGS. 4a-4c illustrate further detail of the representative semiconductor packages mounted to the PCB.
Figure 4B:
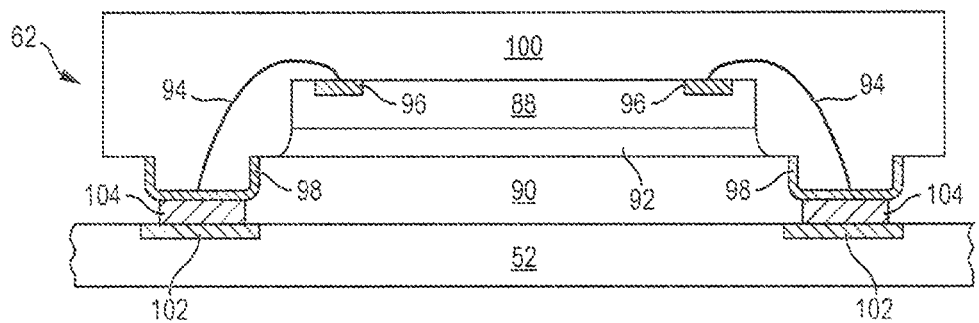
Figure 4C:
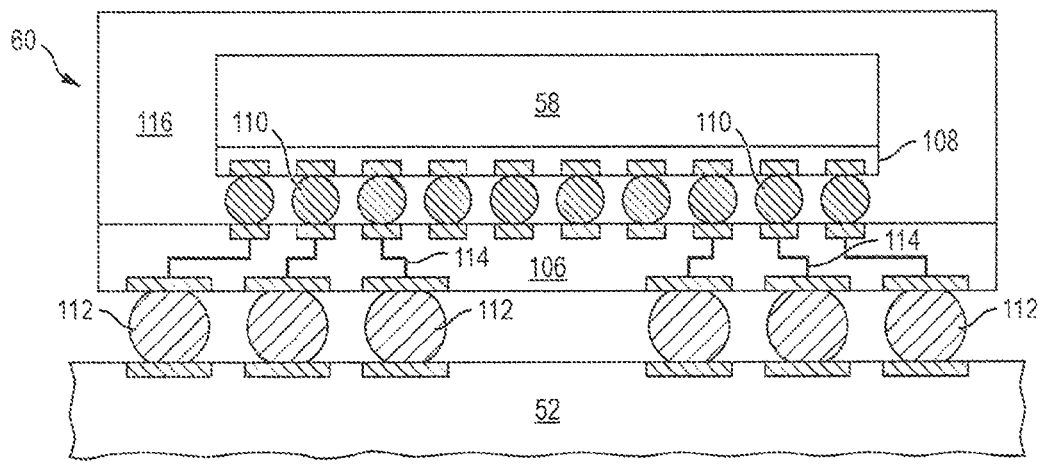

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as Al, Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
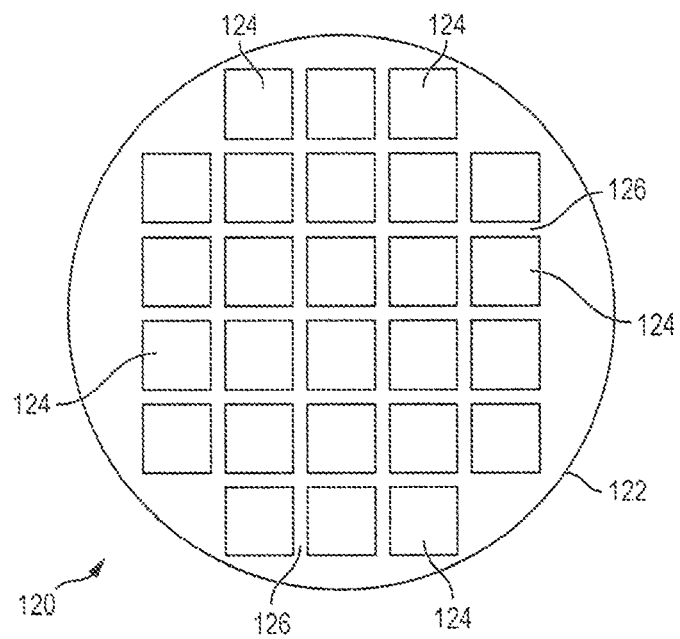
FIGS. 5a-5k illustrate a semiconductor die with a short UBM structure.

FIGS. 5a-5k illustrate, in relation to FIGS. 3 and 4a-4c, a process of forming a bump structure for attaching flip chip die to substrates without underfill molding while controlling solder bridging and shorting among bumps and maintaining robust electrical connections. FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 5B:
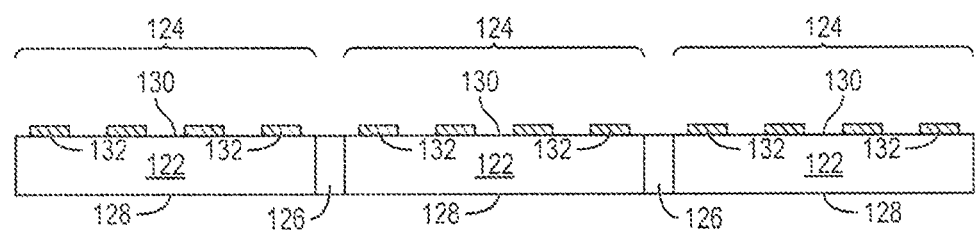

FIG. 5b shows a cross-sectional view of a portion of semiconductor wafer 120. Each semiconductor die 124 has a back surface 128 and active area 130 containing analog or digital circuits implemented as active devices, passive devices, conductive layers, and dielectric layers formed within the semiconductor die and electrically interconnected according to the electrical design and function of the semiconductor die. For example, the circuit can include one or more transistors, diodes, and other circuit elements formed within active area 130 to implement analog circuits or digital circuits, such as digital signal processor (DSP), ASIC, memory, or other signal processing circuit. Semiconductor die 124 can also contain IPDs, such as inductors, capacitors, and resistors, for RF signal processing. Semiconductor die 124 can also be a flipchip type semiconductor die.

An electrically conductive layer 132 is formed over and extends above active area 130 such that a top surface of conductive layer 132 creates an uneven surface, and has a non-planar topology with respect to active area 130. Conductive layer 132 is formed using PVD, CVD, electrolytic plating, electroless plating process, metal evaporation, metal sputtering, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active area 130.

Figure 5C:
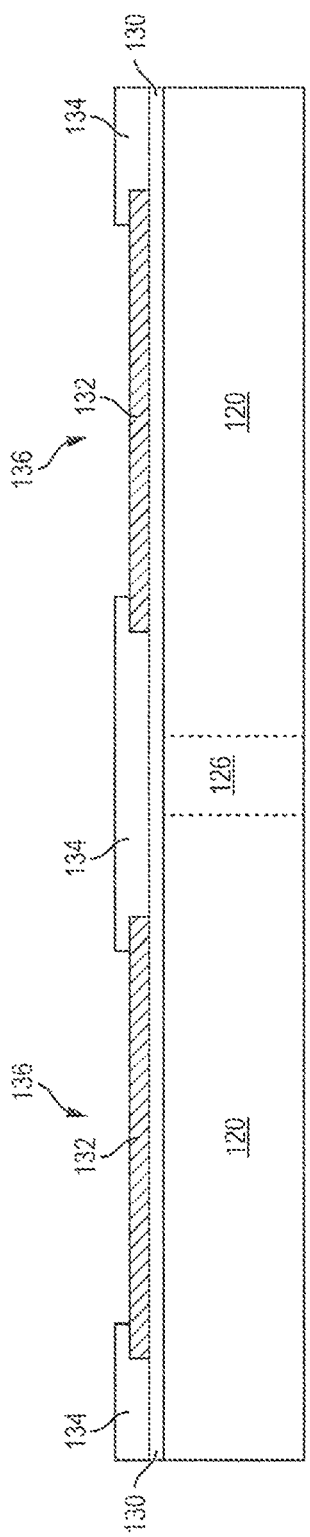

FIG. 5c shows an enlarged cross-sectional view of a portion of semiconductor wafer 120, focusing on conductive layer 132 and an area immediately surrounding the contact pad. An insulating or passivation layer 134 is conformally applied to semiconductor wafer 120 and is formed over active area 130 and conductive layer 132. A bottom surface of insulating layer 134 is conformally applied to and follows a contour of active area 130 and conductive layer 132. A top surface of insulating layer 134 is substantially planar such that the insulating layer has a first thickness over semiconductor wafer 120 outside a footprint of conductive layer 132, and second thickness over semiconductor wafer 120 within a footprint of conductive layer 132. The first thickness is greater than the second thickness. The insulating layer 134 can be one or more layers of silicon dioxide (SiO2), silicon nitride (Si3N4), silicon oxynitride (SiON), tantalum pentoxide (Ta2O5), zircon (ZrO2), aluminum oxide (Al2O3), polyimide, BCB, polybenzoxazoles (PBO), or other material having suitable electrical insulating properties. The insulating layer 134 is patterned or blanket deposited using PVD, CVD, printing, spin coating, sintering with curing, or thermal oxidation. A portion of insulating layer 134 is removed by an etching process to create openings 136 in insulating layer 134 which expose a portion of conductive layer 132. Openings 136 extend from a top surface of insulating layer 134 to a bottom surface of the insulating layer. In one embodiment, opening 136 has a width of 270 μm, analogous to the width of opening 20 from FIG. 1. Another portion of conductive layer 132 remains covered by insulating layer 134.

Figure 5D:
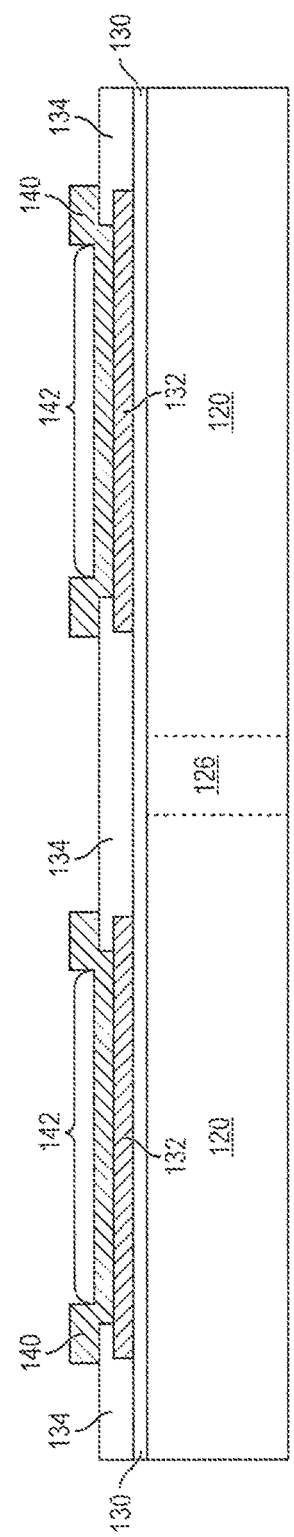

In FIG. 5d, an electrically conductive layer 140 is formed over and conformally applied to conductive layer 132 and over a portion of insulating layer 134 by using a patterning and metal deposition process such as printing, PVD, CVD, sputtering, electrolytic plating, and electroless plating. In one embodiment, wafer 120 is immersed into a electroless nickel plating solution and nickel is plated on conductive layer 132 to a thickness of 3 μm. Alternatively, conductive layer 140 can be one or more layers of Al, Cu, Sn, Au, Ag, or other suitable electrically conductive material. Conductive layer 140 extends across a top portion of, and follows the contours of, the top surface of insulating layer 134, along a side wall of insulating layer 134 at a periphery of opening 136, and across the top surface of conductive layer 132 within opening 136. Conductive layer 140 includes an area 142 that is within a footprint of opening 136 and over conductive layer 132. Area 142 is substantially flat and is smaller than an entire area of conductive layer 132. Conductive layer 140 operates as a first UBM layer for a later formed bump.

Figure 5E:
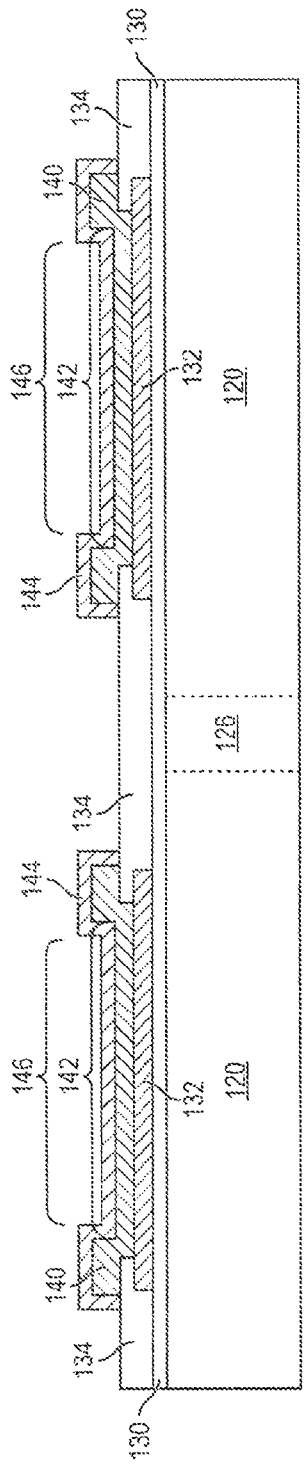

In FIG. 5e, an electrically conductive layer 144 is formed over and conformally applied to conductive layer 140 using a deposition process such as electroless plating or a patterning and metal deposition process such as printing, PVD, CVD, sputtering, and electrolytic plating. In one embodiment, wafer 120 is immersed into an electroless gold plating solution and a layer of gold with a thickness of approximately 100 angstroms is plated on the exposed metal regions of conductive layer 140 with an electroless plating process. In another embodiment, the layer of gold is plated with a thickness of 10-300 angstroms. Alternatively, conductive layer 144 can be one or more layers of Al, Cu, Sn, Ni, Ag, or other suitable electrically conductive material. Conductive layer 144 follows the contours of conductive layer 140 across the surfaces of conductive layer 140 exposed from insulating layer 134 and conductive layer 132. Conductive layer 144 extends across sidewalls of conductive layer 140 from insulating layer 134 to, and across, a top surface of insulating layer 134 and into and across area 142 of conductive layer 140. A top surface of conductive layer 144 includes an area 146 that is substantially flat, formed over conductive layer 132, and is both smaller than, and included within a footprint of, area 142. Conductive layer 144 acts as a second UBM layer that serves as an adhesion layer to aid in the later attachment of a conductive bump to conductive layers 132 and 140. While the use of conductive layers 140 and 144 is a low cost method of forming a UBM, other methods may also be used to form a UBM over conductive layer 132 to aid in the later attachment of a conductive bump.

Figure 5F:
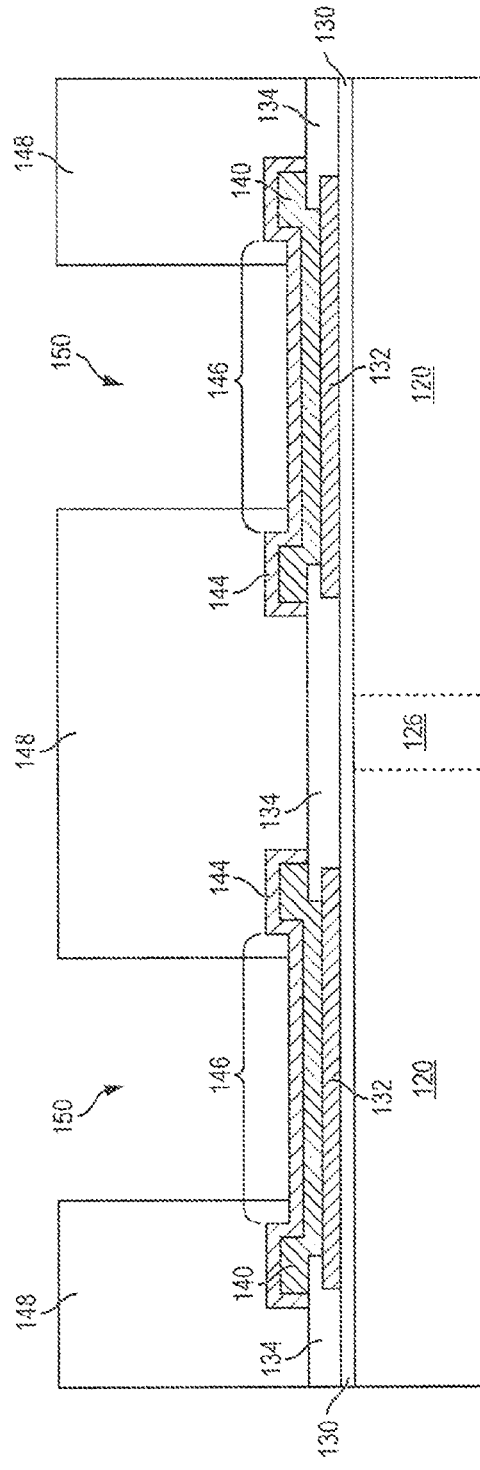

In FIG. 5f, a stencil or masking layer 148 with openings 150 is disposed over wafer 120 such that openings 150 align with and expose central portions of areas 146. Stencil 148 includes a rigid body with a solid surface and is made of metal or other suitable material. Stencil 148 is disposed over an entirety of wafer 120 and includes openings 150 which are formed by a laser or cutting tool at desired locations to align with UBM sites configured to receive later formed bumps. Openings 150 are aligned over a central portion of areas 146 such that a portion of stencil 148 is disposed over a peripheral portion of conductive layers 140 and 144 to separate openings 150 from passivation layer 134. By separating openings 150 and passivation layer 134, later formed conductive material is prevented from spreading or flowing under passivation layer 134. Openings 150 have a height and width formed to contain a predetermined volume of a later deposited conductive paste according to the design and function of the semiconductor package. Accordingly, the volume of later deposited conductive material on area 146 is determined by a thickness of the stencil and a cross sectional area or aperture size of openings 150. In one embodiment, openings 150 have a circular cross sectional area configured to form conductive bumps with a cylindrical shape including a short height and a circular cross section. In another embodiment, openings 150 have a width less than 270 μm which is less than the width of opening 136 in insulating layer 134.

Figure 5G:
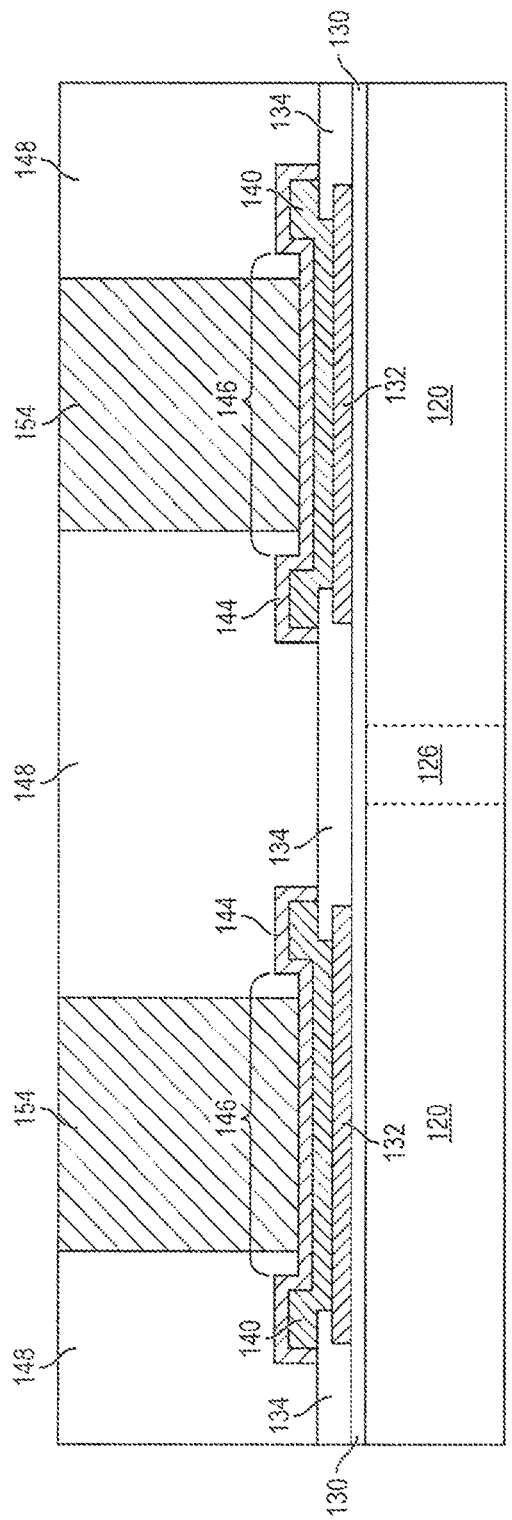

In FIG. 5g, an electrically conductive bump material 154 is deposited within openings 150 and over a central portion of area 146. Conductive bump material 154 can be Al, Sn, Ni, Au, Ag, Pb, bismuth (Bi), Cu, indium (In), solder, and combinations thereof, with an optional flux solution. For example, the bump material can be eutectic Sn/Pb, high-lead solder, or lead-free solder. Conductive bump material 154 is deposited by stenciling the bump material onto conductive layer 144 within openings 150. Stenciling is accomplished by using an object such as a squeegee to force quantities of bump material 154 into openings 150 as the object moves across a top surface of stencil 148. Stenciling is also accomplished by spraying, painting, or brushing conductive bump material 154 into openings 150 within stencil 148. Alternatively, conductive bump material 154 can be injected into openings 150. By stenciling conductive bump material 154 onto wafer 120 and semiconductor die 124, rather than stenciling conductive paste onto a circuit board, a correct location for conductive bump material 154 is provided such that the bump material for forming conductive bumps over a semiconductor die can be deposited for the entire semiconductor wafer 120 in a single step. Furthermore, a volume of conductive bump material 154 deposited on conductive layer 144 is controlled by a thickness of stencil 148 and a cross sectional area or aperture size of opening 150, thereby controlling a final size of the later formed conductive bump.

Figure 5H:
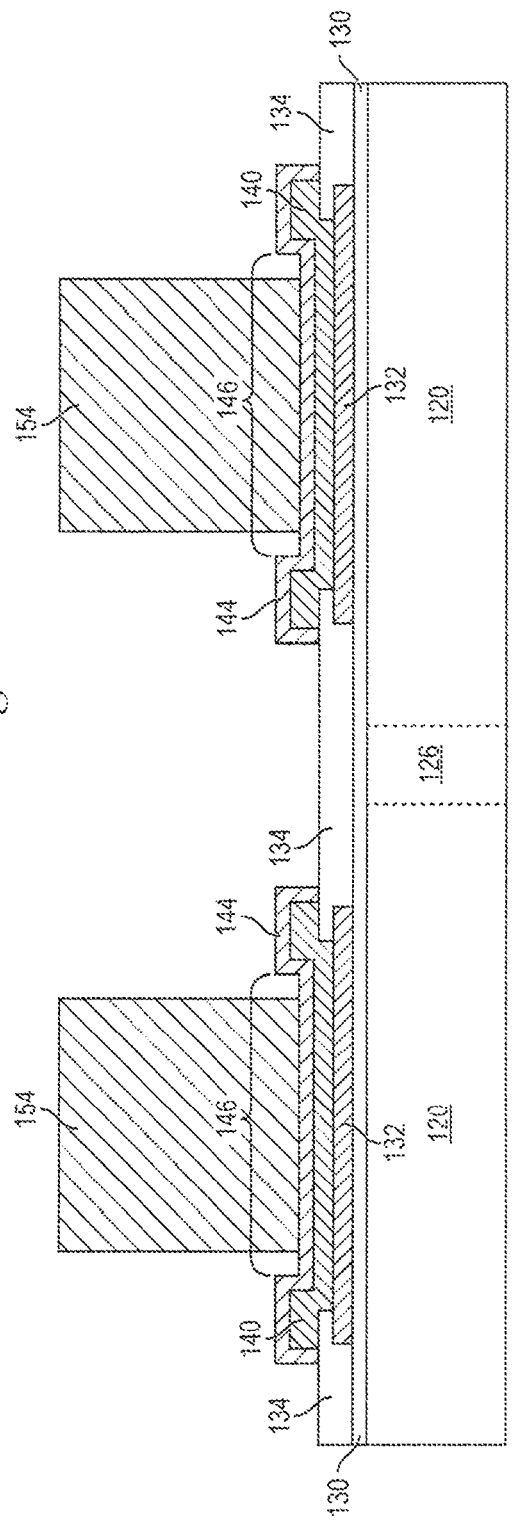

In FIG. 5h, stencil 148 is removed from over wafer 120 leaving a volume of conductive bump material 154 on a central portion of area 146 and over conductive layers 132, 140, and 144. The resulting volume of solder material that remains over conductive layers 132, 140, and 144 will be less than a volume of conductive material from a preformed solder ball used in a ball drop process, wherein the preformed solder ball has a predetermined diameter that corresponds to a width of conductive layer 132.

Figure 5I:
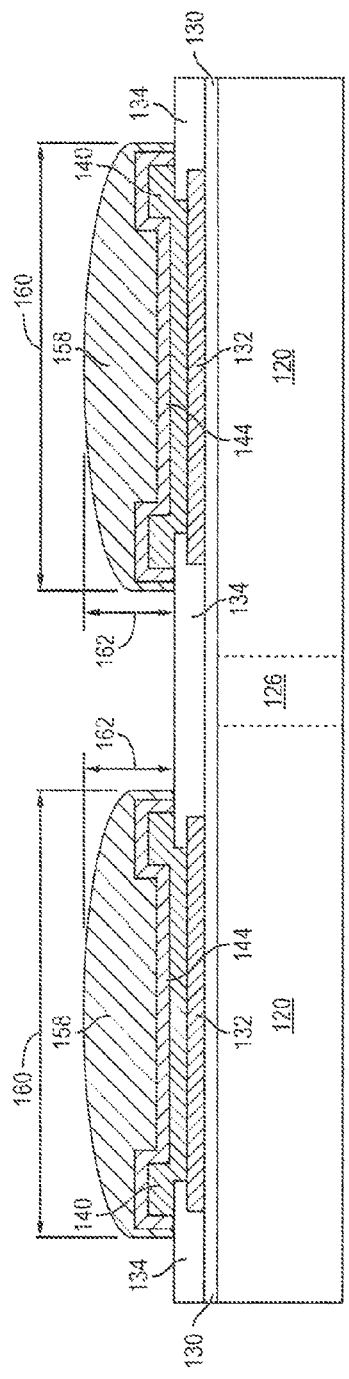

In FIG. 5i, the conductive bump material 154 is reflowed by heating the material above its melting point to form a short conductive bump 158. In some applications, bump 158 is reflowed multiple times to improve electrical and mechanical connections including contact with conductive layers 140 and 144. Subsequent reflows of bumps 158 further include reflowing bumps 158 while connected to semiconductor die 124 to connect semiconductor die 124 and bumps 158 to a later provided substrate, reflowing bumps 158 when mounting semiconductor die 124 to an additional later provided substrate or multilayered PCB, and reflowing bumps 158 for the mounting of additional components to, or rework of, the additional later provided substrate or multi-layered PCB. When reflowing conductive paste 154, the conductive paste travels outward from the central portion of area 146 and contacts a sidewall of conductive layer 144 at a periphery of the conductive layer and contacts a portion of insulating layer 134 adjacent to the periphery of conductive layer 144. The spreading of conductive paste 154 from a first width substantially equal to a width of opening 150 to a second width substantially equal to a width of conductive layer 144 results in short conductive bump 158. Bump 158 has a rounded profile with a width that is greater than a width of conductive paste 154 and a height that is less than a height of the conductive paste deposited in opening 150. In one embodiment, conductive bumps 158 have a width 160 of approximately 300 μm, a spacing between bumps of approximately 200 μm, and a pitch of approximately 500 μm. However, the pitch of openings 150 and the corresponding pitch of bumps 158 can be made much smaller. Additionally, bumps 158 have a height 162 of approximately 70 μm. The resulting short bump 158 has a wider contact area over conductive layer 132 than a contact area of a preformed spherical solder ball of substantially equal height. Similarly, short bump 158 has a height, e.g., 70 μm, which is substantially smaller than a preformed spherical ball with a similar width, e.g., 300 μm. Accordingly, the configuration of bumps 158 provides improved flow of electrical current with respect to preformed spherical solder balls of substantially similar height.

Figure 5J:
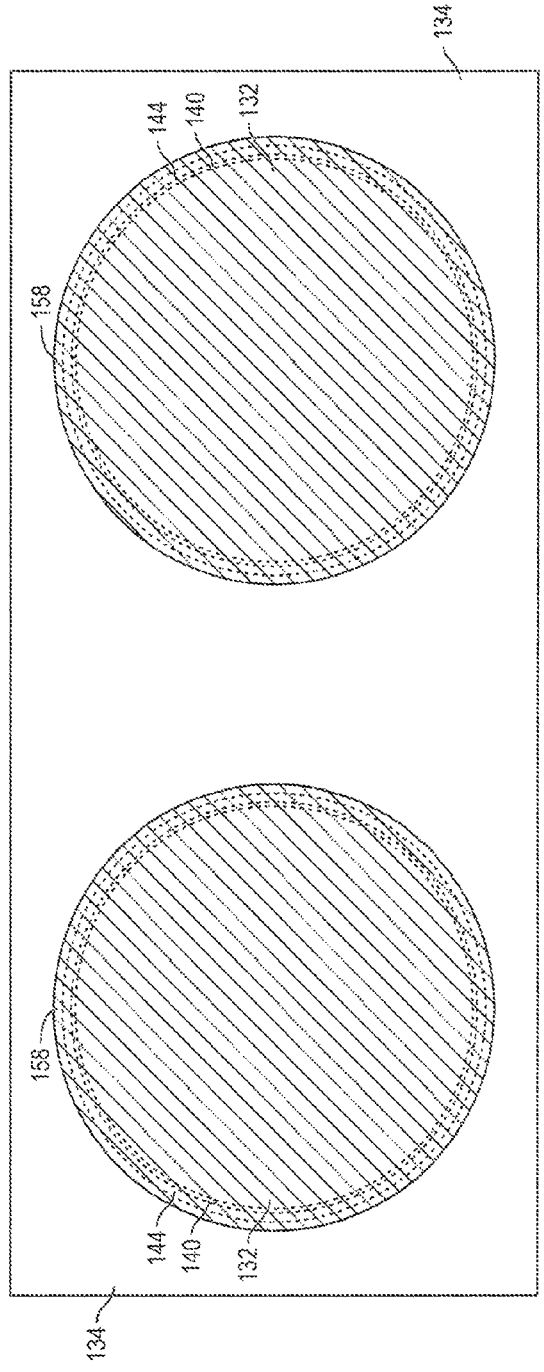

FIG. 5j shows a plan or top view of short bump 158 formed over conductive layers 132, 140, 144, and insulating layer 134. As noted above, in one embodiment conductive layers 132, 140, and 144 have circular cross sections such that reflowed bumps 158 include a cylindrical shape having a short height and a circular cross section.

Figure 5K:
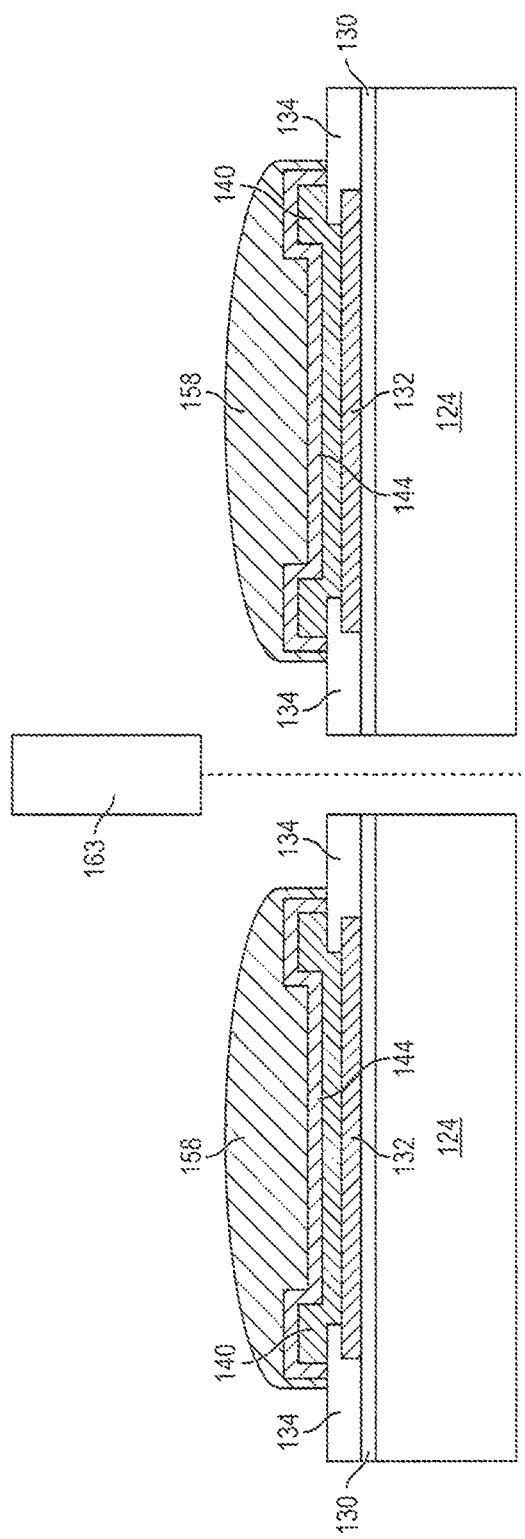

In FIG. 5k, semiconductor wafer 120 is singulated through saw streets 126 with saw or laser cutting tool 163 to form individual semiconductor die 124 with short bumps 158.

Figure 6A:
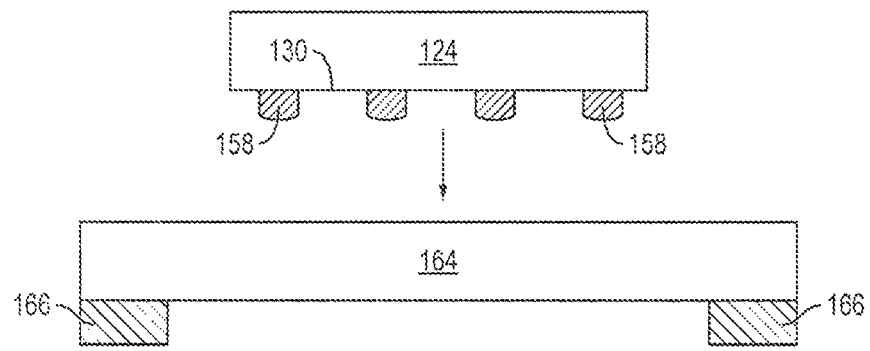
FIGS. 6a-6b illustrate a semiconductor die with a short UBM structure mounted to a substrate without underfill material.

FIG. 6a shows singulated semiconductor die 124 with short conductive bumps 158 from FIG. 5k being mounted to a substrate or multilayered PCB 164 with bumps 158 oriented toward the substrate. Substrate 164 provides general structural support and electrical interconnect for semiconductor die 124 when the semiconductor die is mounted to the substrate. Substrate 164 further includes conductive contacts 166.

Figure 2:
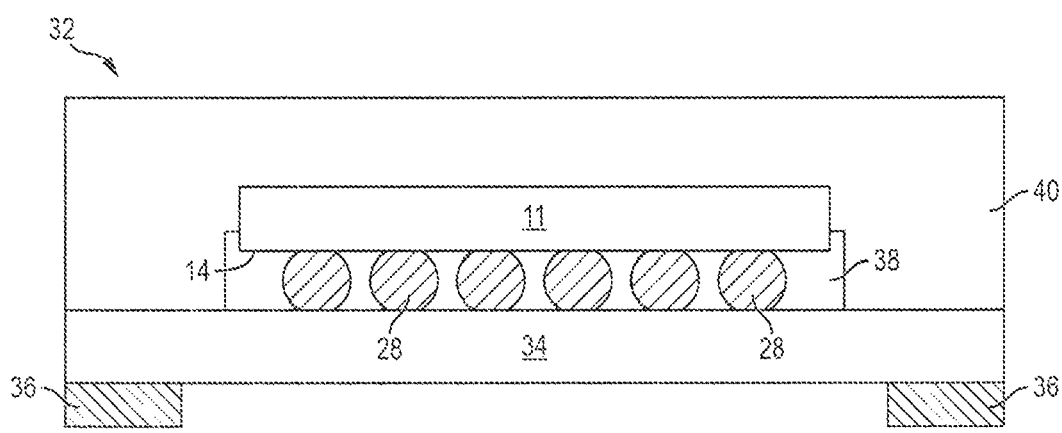
FIG. 2 illustrates semiconductor die including a conventional UBM solder bump structure mounted to a substrate with underfill.
Figure 6B:
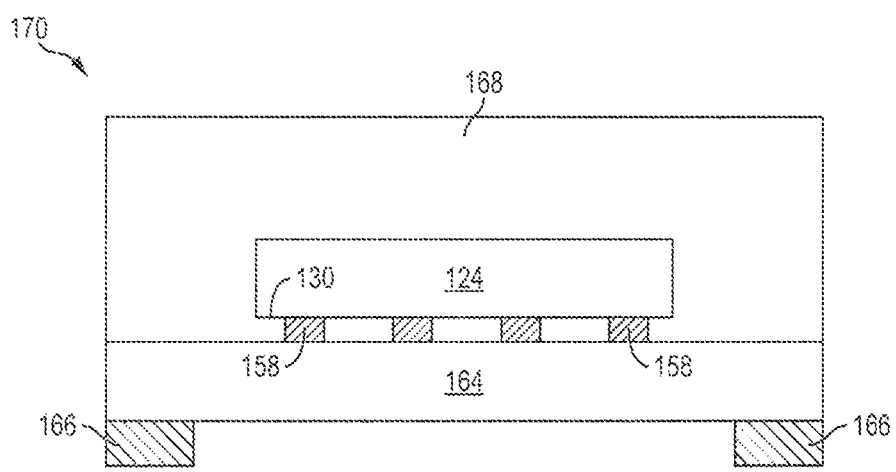

In FIG. 6b, semiconductor die 124 is mounted to substrate 164. No underfill material is deposited around bumps 158 or between substrate 164 and active area 130 of semiconductor die 124. Bumps 158 undergo multiple reflows to improve electrical and mechanical connections. The multiple reflows of bumps 158 include reflowing bumps 158 for connecting the bumps to semiconductor die 124, reflowing bumps 158 while connected to semiconductor die 124 to connect semiconductor die 124 and bumps 158 to substrate 164, reflowing bumps 158 when mounting substrate 164 to an additional substrate or multilayered PCB, and reflowing bumps 158 for the mounting of additional components to, or rework of, the additional substrate or multi-layered PCB. Significantly, a risk of bumps 158 bridging and electrically shorting, even without an underfill material, is reduced due to the reduced height of bumps 158 with respect to traditional spherical bumps like bumps 28 shown in FIG. 2. The reduced volume of bump material present in bumps 158 tends to stay in place over conductive layers 132, 140, and 144 during reflow without spreading to contact other bumps and causing electrical shorting. Therefore, the need for underfill material is reduced and the difficulty of underfill material causing semiconductor die cracking and failure is mitigated.

Encapsulant 168 is formed over substrate 164, and over and around semiconductor die 124 using a paste printing, compressive molding, transfer molding, liquid encapsulant molding, vacuum lamination, or other suitable applicator. Encapsulant 168 can be polymer composite material, such as epoxy resin with filler, epoxy acrylate with filler, or polymer with proper filler. Encapsulant 168 is non-conductive, provides physical support, and environmentally protects semiconductor die 124 from external elements and contaminants. A portion of encapsulant 168 extends at least partially between active surface 130 and substrate 164, especially near a perimeter of semiconductor die 124. Encapsulant 168 can also extend completely under semiconductor die 124 to completely fill the void between active area 130 and substrate 164. A risk of semiconductor die 124 shifting due to placement of encapsulant 168 is reduced due to the reduced height and low profile of bumps 158. Additionally, the problem of mechanical, thermal, and chemical stresses caused by non-uniform underfill material is not present with a uniformly deposited encapsulant. The configuration of SiP 170, including semiconductor die 124 mounted to substrate 164 with short conductive bump 158, creates a shorter electrical path between active area 130 of semiconductor die 124 and substrate 164 than with traditional spherical bumps. The shorter electrical path results in lower resistance and less inductance, especially with high frequency switching applications. The shorter electrical path also results in increased thermal performance of semiconductor die 124 because a reduced stand-off height between the semiconductor die and substrate 164 allows heat from the semiconductor die to be transferred to the substrate more readily. Therefore, the configuration of SiP 170, including the attachment of a flip chip semiconductor die to a substrate with short conductive bumps without underfill molding, reduces the problem of solder bridging and shorting among bumps while maintaining robust electrical connections thereby increasing yield and reliability.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of semiconductor die comprising a plurality of contact pads;
   forming an insulating layer over the semiconductor wafer and the plurality of contact pads;
   forming a plurality of openings in the insulating layer over the contact pads;
   forming a first conductive layer over and electrically connected to the plurality of contact pads;
   forming a second conductive layer over and electrically connected to the first conductive layer;
   providing a mask including a plurality of mask openings with a width less than a width of the openings in the insulating layer;
   disposing the mask over the semiconductor wafer with the mask openings aligned over the plurality of contact pads;
   depositing a conductive bump material within the plurality of mask openings and on the second conductive layer;
   removing the mask;
   reflowing the conductive bump material to form a plurality of bumps with a height of a first bump of the plurality of bumps less than a width of the first bump; and
   singulating the plurality of semiconductor die.

2. The method of claim 1, wherein the plurality of bumps includes a cylindrical shape.

3. The method of claim 1, further including:
   providing a substrate;
   disposing a singulated semiconductor die over the substrate including the bumps oriented toward the substrate; and
   depositing encapsulant over the substrate and between the substrate and the singulated semiconductor die.

4. The method of claim 1, further including aligning a first mask opening of the plurality of mask openings over a central portion of the second conductive layer.

5. The method of claim 1, wherein a volume of conductive bump material included in the plurality of bumps is determined by a volume of the plurality of mask openings.

6. The method of claim 1, further including controlling a volume of the conductive bump material of the first bump to reduce bridging between the bumps.

* * * * *